United States Patent
Barsky et al.

(10) Patent No.: US 7,041,579 B2
(45) Date of Patent: May 9, 2006

(54) HARD SUBSTRATE WAFER SAWING PROCESS

(75) Inventors: Michael Edward Barsky, Sherman Oaks, CA (US); Michael Wojtowicz, Long Beach, CA (US); Rajinder Randy Sandhu, Castaic, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 153 days.

(21) Appl. No.: 10/692,390

(22) Filed: Oct. 22, 2003

(65) Prior Publication Data

US 2005/0090076 A1    Apr. 28, 2005

(51) Int. Cl.
*H01L 21/301* (2006.01)
(52) U.S. Cl. .................. 438/464; 438/465; 438/460
(58) Field of Classification Search ............. 438/464, 438/110, 113, 126, 114, 118, 64, 68, 460, 438/465
See application file for complete search history.

(56) References Cited

U.S. PATENT DOCUMENTS

| | | | | |
|---|---|---|---|---|
| 5,668,033 A | * | 9/1997 | Ohara et al. ............. 438/113 |
| 5,912,477 A | * | 6/1999 | Negley ..................... 257/95 |
| 5,960,260 A | * | 9/1999 | Umehara et al. ........... 438/118 |
| 6,013,236 A | * | 1/2000 | Takahashi et al. .......... 423/345 |
| 6,248,648 B1 | * | 6/2001 | McKenna et al. .......... 438/464 |
| 6,281,032 B1 | * | 8/2001 | Matsuda et al. ............ 438/42 |
| 6,551,906 B1 | * | 4/2003 | Oka ......................... 438/465 |
| 6,586,315 B1 | * | 7/2003 | Dewa ....................... 438/464 |
| 6,828,217 B1 | * | 12/2004 | Nguyen et al. ............ 438/462 |
| 2002/0178883 A1 | * | 12/2002 | Yamamoto .................. 83/22 |
| 2003/0121511 A1 | * | 7/2003 | Hashimura et al. ......... 125/2 |

* cited by examiner

*Primary Examiner*—David Zarneke
*Assistant Examiner*—Victor V. Yevsikov
(74) *Attorney, Agent, or Firm*—Ronald M. Goldman; Scot R. Hewitt

(57) ABSTRACT

Die of high aspect ratio formed in a hard wafer substrate are sawed out without requiring tape, obtaining high die yields. Preliminary to sawing the semiconductor die (3) from a sapphire wafer (2), the wafer is joined (20) to a silicon carrier substrate (6) by a thermoplastic layer (4) forming a unitary sandwich-like assembly. Sawing the die from the wafer follows. The thermoplastic is removed, and the die may be removed individually (50) from the silicon carrier substrate. Thermoplastic produces a bond that holds the die in place against the shear force exerted by the saw and by the stream of coolant (30).

18 Claims, 2 Drawing Sheets

HARD SUBSTRATE WAFER SAWING PROCESS

FIELD OF THE INVENTION

This invention relates to the manufacture of semiconductor chips and, more particularly, to the process of sawing semiconductor chips that possess a large aspect ratio from the wafer substrate, where the substrate is a very hard material.

BACKGROUND

A conventional procedure for manufacture of semiconductor chips in commercial quantities is to fabricate or process a great number, hundreds or thousands, of identical chips simultaneously on a large size wafer of substrate material. Each semiconductor chip defines or contains a copy of the circuit of a power amplifier, low noise amplifier, computer processor, an electronic component or electronics components of greater complexity. That circuit fabrication on the wafer typically uses conventional doping, photoresist and etching processes, the details of which are well known and not relevant to the present invention. Once circuit fabrication is completed, the wafer is cut apart, parsed, into individual chips for individual handling, testing, lead attachment and/or packaging and generally finished into a device suitable for insertion into electronics equipment.

Separation of the individual chips from the unitary structure formed with the wafer is accomplished by sawing. As part of the circuit processing and in preparation for the subsequent sawing of the chips, described above, a grid of parallel lines is marked or drawn in a cross-hatch pattern on the side of the wafer containing the formed circuits. Those lines, referred to as saw lines, serve as the boundaries to the large number of regions of the real estate of the wafer each of which contains an individual chip or, as sometimes referred to, die, and guides alignment of the wafer in the saw apparatus and in sawing. The underside of the processed wafer is placed in contact with the sticky side of a length of adhesive tape, which serves as a carrier for the wafer. Held in that carrier by the adhesive, the wafer is sawed through with a circular saw blade along the saw lines to cut out the chips or die, while leaving the adhesive tape undisturbed. Following the sawing operation, the semiconductor die may be individually detached from the adhesive tape and thereafter may be finished into a packaged chip ready for use.

The friction produced by sawing the wafer produces heat. To prevent the saw blade and the wafer from overheating the sawing apparatus directs a stream of deionized water onto the cutting edge of the blade to cool the blade during cutting. That stream also strikes the wafer as well. The rotating blade of the saw also produces vibrations. The adhesive tape prevents the die that are cut from the wafer from being blasted away by the force of the coolant water stream during the sawing procedure or bounced off the wafer support by the vibration, both of which are undesirable.

As one appreciates, the rate of coolant flow employed is functionally dependent on the amount of heat produced in sawing the wafer and that coolant rate in turn greatly depends on the hardness characteristic of the wafer substrate material. Substrate materials commonly used in the past in volume production employed wafers of Gallium Arsenide (GaAs), which has a hardness of 4 to 5 on the Moh's scale, Silicon (Si) which has a hardness of 7 on the Moh's scale, and, less commonly used, Silicon carbide (SiC), which has a hardness of 9.5 and Sapphire, which has a hardness of 9 on that scale. Relatively speaking, the GaAs, Silicon and Silicon Carbide are of a hardness that is relatively low, while the Sapphire and Silicon Carbide possess a high hardness. Consequently, a greater amount of heat is produced when sawing a sapphire wafer and the coolant flow, and, hence, the force exerted by the flow, must be greater than when sawing the other wafer materials.

However, in those previous applications, the area of the die (length by width) in contact with the adhesive surface of the tape is relatively large. The height of the die is low relative to the length and width of the die, which gave the die a relatively low aspect ratio, the ratio of the die height to the length or width. As example, a typical GaAs integrated circuit has an aspect ratio of 0.03. Since the greater the contact area, the greater the adhesion, the adhesive tape exerted a retaining force on the respective die that was greater the shear force exerted thereon by the coolant stream and also greater than the mechanical moment produced by the application of the coolant stream to the upper end of the respective die.

Moreover, the adhesive bond of the tape carrier to the die is intended to be releasable, not permanent. Even though the adhesive bond of the tape is sufficient to retain the die on the support during the sawing procedure, after the procedure is completed, the die could be individually plucked from the tape for further handling. Plucking is accomplished manually by gripping the die with a tweezer or the like and pulling the die upward off the tape, overcoming the adhesive bond, whereupon the tape released the die.

That convenient and widely employed sawing procedure appears to have reached a limit with the advance in transistor technology. Transistors formed of Gallium Nitride ("GaN") constructed on substrates of sapphire or silicon carbide have proven useful as high electron mobility transistors ("HEMT"), power amplifiers and low noise amplifiers. To be economically feasible, it is necessary to fabricate those transistors in commercial volumes, much in the same way as is accomplished in the production of the prior GaAs transistors, namely the production of large numbers of transistors on a wafer that is commercially available in a standard size. Quite routinely, the described sawing procedure was applied to the manufacture of the Gallium Nitride transistor, but with devastating effect.

Of the two appropriate substrate materials for the GaN, Silicon carbide is prohibitively expensive, leaving sapphire as the substrate of economic choice for the GaN transistors. It was found that the surface area required of an individual transistor die was quite small, about 300 microns in length by 150 microns in width, enabling the designer to pack a large number of those die into the area described by the sapphire wafer. In contrast, the substrate to be diced had a depth of 300 to 600 microns, effectively exhibiting a high aspect ratio for the individual die. Because sapphire is a very hard material, sawing the wafer was anticipated to generate more heat than usual and, accordingly, the coolant flow of the saw was appropriately increased to avoid thermal damage to both the saw blade and the wafer.

That coolant flow produced two profound adverse effects. First, localized heating from the interaction of the saw blade with the hard material led to a breakdown in the adhesive properties of the adhesive tape. Secondly, the increased coolant flow produced sufficient force to detach and blow the individual die formed by the sawing from the tape, scattering the die about. When sawing produced a number of the cross-hatched saw lines defining a portion of the die, one was surprised to find that the force of the coolant stream blasted the semiconductor die off the cutting table, much like a garden hose would blast a pile of ping-pong balls all over the room. The scattered die were thus considered contaminated and could not be used. Continuing sawing out additional die produced the same result. The yield of useable die from the wafer was essentially zero. The tried and true prior art sawing process failed. Applicants confronted a situation of first impression then without known remedy.

Lessening the coolant flow rate was not a practical alternative, since frequent replacement of the saw blades alone was too expensive. Increasing the strength of the adhesive was also not a solution. The adhesive strength would have to be increased so greatly as would make it difficult or impossible to pluck die from the tape on completion of sawing. Increasing the surface area of the semiconductor die, as example quadrupling the surface area and, thereby, reducing the aspect ratio of the die, would produce greater adhesive strength of an individual die to the tape. However, the number of die that could be fabricated on a given wafer would be reduced by three-quarters, prohibitively increasing the cost of a chip and rendering the chip economically unfeasible. Until the present invention no way was known to accomplish economical dicing of high aspect ratio semiconductor chips from a sapphire wafer.

Accordingly, an object of the present invention is to provide an effective and economically viable process for sawing semiconductor chips formed on very hard substrates.

A further object of the invention is to provide adhesion between high aspect ratio die that are cut from a wafer of hard material and a supporting carrier that is strong enough to resist the impact of coolant required during sawing of the die and eliminate that adhesion when it is desired to remove the die from the carrier.

An additional object of the invention is to provide a novel process for sawing GaN chips that are formed in a sapphire wafer.

And, a still additional object of the invention is to provide a carrier arrangement for use in the process of sawing semiconductor chips from a wafer that does not employ adhesive tape.

SUMMARY OF THE INVENTION

In accordance with the foregoing objects and advantages, the sawing method enables small pieces of high aspect ratio to be sawed out from very hard materials while preventing the small pieces so produced from being scattered about by the coolant stream that cools the saw blade. As applied to the manufacture of semiconductor devices on sapphire, a very hard material, in this method a sapphire wafer containing semiconductor die is joined by thermoplastic material to a silicon carrier substrate, suitably a wafer of silicon, to form a unitary sandwich assembly in preparation for sawing out the die from the wafer. The thermoplastic produces a bond strong enough to hold the die in place against the shear force exerted on the die by the stream of liquid coolant used to cool the saw blade during sawing and by the rotating saw blade as the saw cuts through the sapphire wafer, even when the die are of a high aspect ratio. Afterwards, the thermoplastic material is chemically removed and the die may be picked individually from the silicon carrier substrate.

As an additional feature, the device side of the wafer is covered with a protective layer, such as a photoresist, prior to sawing. In accordance with another feature of the invention the thermoplastic is applied in the liquid form over the backside of the wafer and baked to harden the thermoplastic. The wafer is then placed with the backside against the substrate carrier and heated to liquefy the thermoplastic, followed by cooling to solidify the thermoplastic and form a unitary sandwich assembly of wafer, thermoplastic and substrate carrier. Thereafter, the wafer is sawed out to form the die.

In an alternative procedure, the thermoplastic is applied as a sheet to the upper surface of the carrier substrate and the wafer is placed atop that sheet. The wafer and carrier are then placed in compression and heated to liquefy the thermoplastic. That step is followed by cooling the assembly to re-harden the thermoplastic and thereby bond the wafer and carrier together in a unitary sandwich assembly.

The foregoing and additional objects and advantages of the invention, together with the structure characteristic thereof, which were only briefly summarized in the foregoing passages, will become more apparent to those skilled in the art upon reading the detailed description of a preferred embodiment of the invention, which follows in this specification, taken together with the illustrations thereof presented in the accompanying drawings.

DESCRIPTION OF THE PREFERRED EMBODIMENTS

Figure 1:
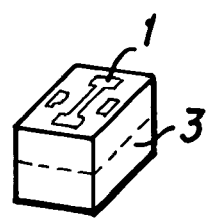
FIG. 1 pictorially illustrates, not-to-scale, an individual chip cut from the wafer on which the chip was formed.
Figure 2:
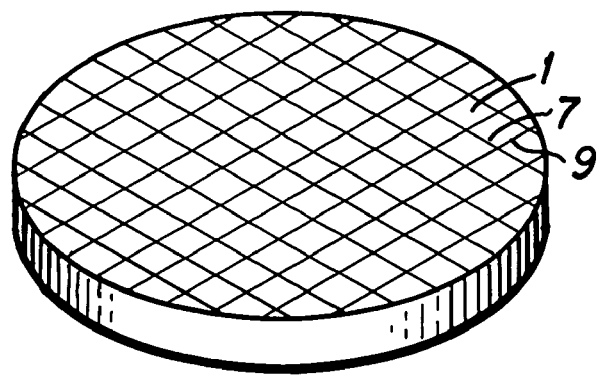
FIG. 2 pictorially illustrates, not to scale, saw lines marked on the upper surface of the wafer to define the borders of the individual chips formed in the wafer.

Sawing of a semiconductor wafer is accomplished after the wafer has been processed to form a large number of copies of a semiconductor device on the upper surface, such as the semiconductor device 1 pictorially illustrated (not-to-scale) in the die or chip 3 in FIG. 1. As pictorially represented in FIG. 2, those semiconductor devices 1, only one of which is numbered, are typically arranged in a regular grid-like pattern on the surface of the wafer 2, spaced a short distance from one another in rows and columns. That arrangement enables a circular saw to be moved along a series of parallel lines, the saw lines, first in one direction 7, and then in an orthogonal direction 9 thereto to define the small separate square or rectangular shaped regions of wafer real estate, referred to as chips or die.

Typically, the formed semiconductor devices extend a short distance into the depth of the processed wafer. The remainder of the wafer thickness or height constitutes solely the substrate material, such as the silicon carbide or sapphire materials dealt with in the new sawing procedure. The die with which the present invention is most concerned has a height of between 500 to 600 µm and a width of between 150 to 300 µm, defining an aspect ratio of between 2.0 and 4.1. The processes to fabricate those semiconductor devices on a wafer are well known and not relevant or material to the understanding of the present invention and, hence, need not be further described in detail. Those fabrication processes are noted to place the application of the improved sawing method in appropriate context, and serve as reminder of the need to protect the semiconductor devices against damage during any sawing procedure. The semiconductor wafer as processed to form the semiconductor devices on the surface is marked with the cross-hatched parallel lines 7 and 9, referred to as saw lines, that serve as the guide for sawing, and for visually aligning the wafer in the sawing apparatus.

The processed wafer is typically cleaned before being introduced to a sawing process, such as by soaking the wafer in acetone and then in isopropyl alcohol for appropriate intervals, rinsing in deionized water and following that bath with a blow dry, all of which is conventional.

Figure 3:
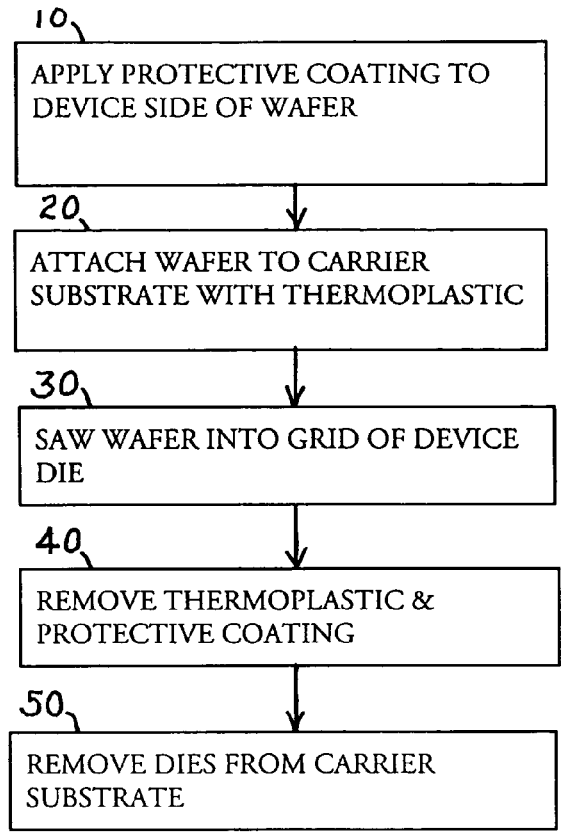
FIG. 3 is a flow chart of the new process.

Reference is made to the flow chart of FIG. 3 illustrating an embodiment of the new sawing procedure. As represented in block 10, a protective coating is applied to the device side of the cleaned device-processed wafer to protect the devices on the wafer from being directly struck and damaged by any shards of material produced during sawing. That protective coating is preferably a photo-resist that is applied in the liquid form. A uniform coating is obtained by applying the liquid photoresist on the wafer and rotating the wafer at about 4,300 rpm for a minute or so, allowing centrifugal force to spread the coating evenly over the wafer surface. Some of the photoresist may flow over the edge of the wafer to coat the cylindrical side wall thereof, which is acceptable. The bottom surface should, however, remain clean. Then the coated wafer is baked in an oven for an appropriate interval to harden or cure the photoresist and form the protective coating for the semiconductor devices on the wafer.

Although the upper surface of the wafer is coated with photoresist at this stage of the process, the photoresist is translucent or transparent, enabling the saw lines, earlier referred to, that are marked on the surface to show through so that the technician is able to observe the lines during actual sawing.

Figure 6:
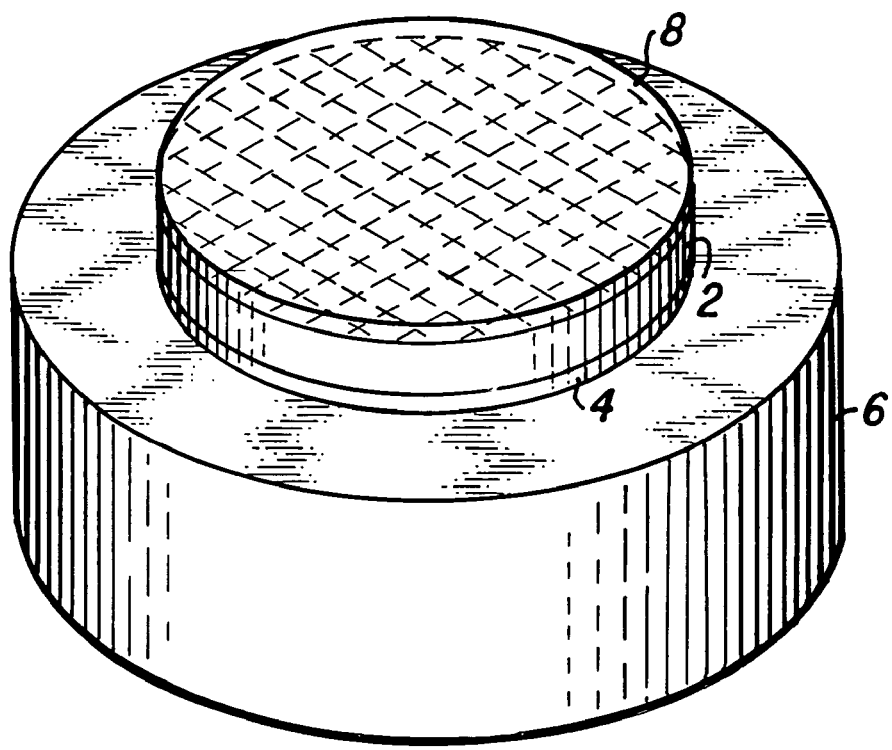
FIG. 6 is a pictorial section view, not to scale, of the wafer, thermoplastic, and carrier substrate sandwich assembly produced in the new process as readied for the sawing operation.

The next step in the process is to attach or bond the wafer to a carrier substrate using a thermoplastic material as the bonding or adhesive agent as represented in block 20. The carrier substrate is suitably formed of a slab or wafer of silicon in a flat geometry that is larger in area and much greater in thickness than the wafer, and is very rigid. That carrier substrate 6 is illustrated in FIG. 6, which may be referred to briefly. Returning to FIG. 3, attachment may be accomplished in two ways. The first, illustrated in FIG. 4, which is preferred, uses a liquid thermoplastic. The second, illustrated in FIG. 5, uses a sheet of thermoplastic material.

Figure 4:
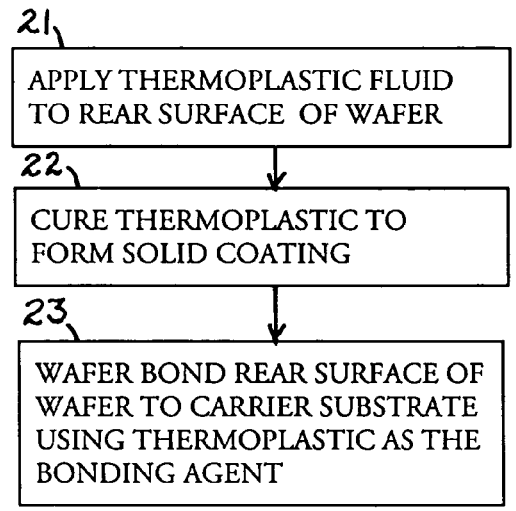
FIG. 4 is a flow chart of the steps that are preferably used to perform one of the steps of the process of FIG. 3.
Figure 5:
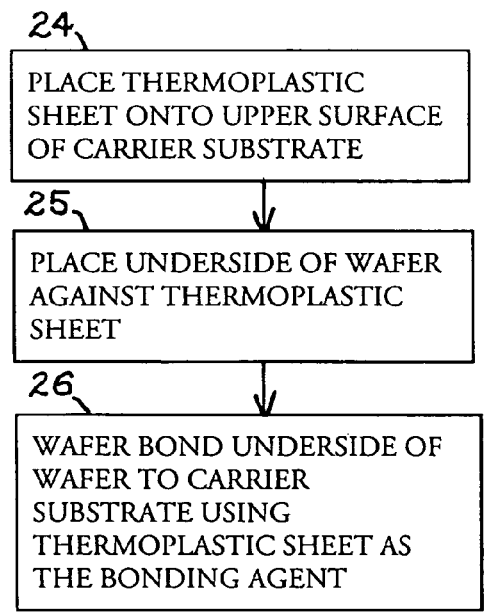
FIG. 5 is a flow chart of the steps that may be used as an alternative to the steps of FIG. 4 in performing one of the steps of the process of FIG. 3.

Considering the preferred procedure of FIG. 4, as represented in block 21, the backside of the wafer is coated with the liquid thermoplastic. Specifically, after the photoresist is hardened in accordance with the preferred method of the previous step, the wafer is turned over to expose the back surface. The thermoplastic fluid is deposited onto the back surface of the wafer, and the thermoplastic coated wafer is then rotated at high speed for an appropriate interval, allowing centrifugal force to spread and evenly coat the backside surface, much as occurred in coating the photoresist on the device side.

As represented by block 22, the thermoplastic coated wafer is then placed in an oven and baked to cure the thermoplastic, that is, drive off the solvents in the thermoplastic material that are responsible for preventing the thermoplastic liquid from solidifying at room temperature, and the thermoplastic coating solidifies.

The photoresist and thermoplastic covered wafer is then bonded to a carrier substrate, using the thermoplastic as the bonding adhesive as represented by block 23 in FIG. 4. Suitably a conventional bonder apparatus is used to perform that part of the process. The wafer is then turned over so that the thermoplastic covered back side is placed in abutment with the carrier substrate. Typically, the bonder apparatus compresses the wafer against the carrier with the thermoplastic material sandwiched in between. While so compressed, the sandwich assembly is heated to liquefy the thermoplastic material. When liquefied, the thermoplastic conforms to the surfaces and fills any microscopic interstices in the adjoining surfaces of the wafer and carrier. The heat is then removed and the assembly is cooled or is allowed to cool as desired, the thermoplastic hardens and forms the bond, attaching the wafer to the carrier. At this stage, the now unitary assembly of wafer and carrier appears as shown in the pictorial view of FIG. 6. with the wafer 2, the thermoplastic 4, carrier substrate 6, and protective coating 8 overlying wafer 2. The wafer is now ready for sawing.

Alternatively, If one desires to use a sheet of thermoplastic material instead of the liquid thermoplastic, such as is available in sheets of one to ten mils in thickness, that permissible alternative follows a slightly different procedure. That alternative is illustrated by the flow chart of FIG. 5. As represented by block 24, a covering sheet, sized to the surface of the wafer, is placed over the carrier substrate. As represented by block 25, the wafer is then placed with the back side of the wafer in abutting relationship with the sheet of thermoplastic material to form a pile, that is, disconnected assembly of wafer and carrier substrate with the thermoplastic material sandwiched in between. Finally, as represented by block 26, the wafer is wafer bonded to the carrier substrate using a wafer bonder. The description of that wafer bonding operation was earlier described in connection with FIG. 4 and is not repeated. The wafer is now ready for sawing. As is evident, since the back side of the wafer is not coated with thermoplastic in this alternative procedure, one is not required to invert, that is, flip-over the wafer, which is somewhat of an advantage.

Returning again to the flow chart of FIG. 3, as represented by block 30 the wafer is now sawed to cut-out the individual die of semiconductor devices. Using the saw lines on the wafer as a guide, the carrier and wafer assembly is properly aligned in a saw apparatus conventionally used in the industry to saw semiconductor wafers. That apparatus includes a circular saw blade that is rotated at high speed during operation with sawing accomplished by pressing the moving cutting edge of the blade against the wafer and running the rotating saw blade along the saw lines.

The sawing apparatus also contains a fluid nozzle, not illustrated, directed at the saw blade, at the location at which the saw blade bites into the wafer. That nozzle is connected to a supply of coolant. Once operating, the saw cuts the cross-hatch pattern, illustrated in FIG. 2, into the wafer, and, concurrently, the coolant is pumped and sprayed through the nozzle onto the saw blade and the wafer. The saw apparatus is automated and cuts the cross-hatched parallel lines at the locations on the wafer specified by the operator in the program for the apparatus. The details of that programming are known and not material to an understanding of the invention. The cut is deep enough to cut through the wafer 2 (FIG. 6) and the thermoplastic material 4, and also slightly cut into the underlying silicon substrate carrier 6. The sawing then parses the wafer into the individual die and a small amount of scrap.

It was found that any localized heating that occurred during sawing remained below the temperature at which the thermoplastic material softens and liquefies, and the adhesive bond between individual die and the carrier substrate remained strong. Further, the force exerted by the coolant spray on the die was insufficient to overcome the adhesive strength of the thermoplastic material. Hence, the blast of the spray did not detach any of the semiconductor die being cut out from the wafer from the substrate carrier. The cut-out die were held in place, upstanding. On completion of sawing the semiconductor die remain in place adhered to the substrate carrier, to some resembling the head of a meat hammer. The foregoing results proved the advantage of the procedure over the failed tape process, earlier described in the background to this invention. Although more complicated than the prior adhesive tape process, the foregoing procedure accomplished successful sawing in circumstances in which the tape process could not do so.

Continuing with FIG. 3, in the next step, as represented by block 40, the remaining photo-resist protective coating, some of which was removed by the sawing operation, is removed from the die. Photoresist removal is accomplished by an acetone soak.

Next the remaining thermoplastic material is removed, as also represented in block 40. For this step, preferably, the carrier-die assembly is carefully placed in a wafer dish and soaked in isopropyl; and then soaked in PRS200 brand N-Methyl Pyrollidone, a solvent, followed by a rinse in deionized water. Then the carrier-die assembly is soaked in acetone in the wafer dish, which removes all the thermoplastic material. The die are now effectively detached from the underlying substrate carrier and remain standing upright in the wafer dish. At this stage, care must be exercised to avoid jarring the wafer dish as would cause the individual die or chips to tip over and/or scatter off the dish.

The semiconductor die may now be individually removed and air dried as represented by block 50, which essentially completes the sawing procedure. The die are then delivered for further handling, packaging and testing on an individual basis in the conventional manner, not relevant to the present invention.

An alternative for removing the thermoplastic in the foregoing process without requiring use of a solvent is to place the carrier-die assembly on a hot plate, and heat the carrier-die assembly to a temperature at which the thermoplastic changes to the liquid state. The die may be removed individually. Once removed from the hot plate the thermoplastic cools and resolidifies.

The thermoplastic material turns to a viscous fluid when the material is raised to a very high temperature. Below that temperature, the thermoplastic becomes hard and possesses a high shear force number of 3,000 psi or so and is capable of withstanding high shear forces, particularly the shear force produced by the stream of coolant which is aimed at the top side of the relatively elongate die and that produced by the rotating saw blade.

In one practical embodiment of the new process, the protective coat was Clariant's A24620 photoresist, that was manually coated by rotating at 4300 rpm for sixty seconds, then oven baked at 110 degrees for twenty minutes to harden the photoresist, and then allowed to cool for at least five minutes. The wafer was mounted to a small chuck face down and thermoplastic (in liquid form) was applied over the backside of the wafer, and the wafer was rotated at 3,000 rpm for about eighty seconds. The wafer was then placed in an oven and baked at 190 degrees C. for about fifteen minutes to remove the chemical inhibitors from the thermoplastic allowing the thermoplastic to harden and adhere to the wafer, and the wafer is allowed to cool down for about five minutes. The wafer is now backed by the thermoplastic coating. A silicon carrier of a short cylindrical shape, as example, larger in diameter than the wafer, was prepared by blowing off any dust on the carrier surface, spraying same with acetone, then with methanol, and rinsing in deionized water, followed by a blow dry. The silicon carrier was placed in the bonder apparatus on a sheet of filter paper. The wafer was turned over and the backside thereof placed atop the surface of the carrier.

The bonder apparatus then was operated and compressed the wafer against the carrier and commenced baking. The sandwich assembly was baked at 190 degrees C. for fifteen minutes. At that temperature, the thermoplastic becomes a viscous fluid that fills all the minute pores in the adjoining surfaces of the carrier and again in the wafer. The bonder then proceeded through a cooling cycle, ending at a temperature of 40 degrees C. That cooled the thermoplastic, which hardens firmly. attaching the wafer to the silicon carrier. The thickness of the carrier and wafer may be measured at this stage to ensure proper setup of the sawing equipment.

The sandwich assembly is then mounted in a wafer chuck (without adhesive tape), and the automated saw apparatus is programmed and calibrated. A five mil thick circular saw blade is installed in the apparatus. Sawing commences, the saw moves along the saw lines and the wafer devices are sawed out. Notwithstanding being sawed out, the individual die on the wafer remain firmly attached to the silicon carrier by the thermoplastic material and the top surface of the die remain covered by the photoresist. Following sawing, the wafer is placed in a wafer dish and soaked in acetone for about five minutes to remove the photoresist.

Then the wafer is soaked in isopropyl for about five minutes, a soak in PRS200 at 90 degrees C. for about five minutes, agitating the wafer after about two minutes. Then the wafer is rinsed in deionized water for about five minutes, and is given an acetone soak for about five minutes. The latter soak detaches the thermoplastic from the carrier substrate and from the underside of the chips.

Although the new method was described for the sawing the entire semiconductor wafer into individual semiconductor die, as those skilled in the art appreciate, the method is not so limited and may be combined with the sawing method of the prior art that employs the adhesive tape as a carrier. As example, a single large wafer of hard material, such as the sapphire, may be attached to the adhesive tape, serving as the carrier, and the wafer is then sawed into four large pieces with a conventional rotary (dicing) saw, often referred to as sub-cutting. That sawing includes the coolant stream directed at the rotating blade of the saw during the sawing of those semiconductor die. Since the four pieces being cut out of the wafer are relatively large in size, the stream of coolant fluid will not force those large-size pieces from the adhesive tape. The aspect ratio of those large pieces is quite low. Each of those quarters of the wafer contain appropriate saw lines defining the individual chips. Following that initial processing, each of the four pieces of the wafer may then be sawed and diced individually using the sawing method disclosed herein. The foregoing procedure may be desired if fabricating four different types of chips in respective quarter sections of the wafer and different types of chips may be of different lengths and widths. Each quarter of the wafer would then be handled separately for sawing. Thus, it should be understood that the term wafer as used in the claims herein should be construed to including in meaning not only an entire wafer, but also as a section or part of a wafer.

Although the greatest advantage and value of the disclosed method is in the dicing of semiconductor die of high aspect ratio formed in a semiconductor substrate of a high hardness characteristic, the method need not be excluded from other applications. There may be circumstances in which one might choose to use the foregoing sawing method in dicing semiconductor die in wafers of material of normal or low hardness and/or in which the aspect ratio of the individual die is not high in lieu of the less complex adhesive tape method.

As example, in some instances of specialty semiconductor manufacturer, one might pluck a number of the semiconductors from the adhesive tape sufficient to satisfy the needs of the customer order, leaving a quantity of the die on the tape. Then the tape with the remaining die is stored away for possible use some time in the future, perhaps years, should the customer return and wish to purchase additional semiconductor devices that use the same semiconductor chips. That is not the best form of long-term storage, particularly since the manufacturer of the adhesive tape does not recommend retaining die in that manner. The character of the adhesive may change with time, and, ultimately, the adhesive may form a permanent bond to the semiconductor die, preventing removal of the die. Notwithstanding, some manufacturers like to store the spare die that way for other reasons or no reason at all. With the more complex disclosed method the die are attached to the carrier substrate with thermoplastic, and that material does not change characteristics over time. Thus spare die may be safely stored on the carrier substrate, held to the substrate by the remaining trace of thermoplastic, an advantage of the present invention.

The new sawing method may be used to produce small chips of hard material is used in cutting tools, such as on saw blades. Silicon carbide saw blades are constructed by bonding minute pieces of silicon carbide to the cutting edge of the circular saw blade. Because of the hardness of the carbide material, the cutting power of the saw blade is greatly enhanced. Although the applicant's do not have knowledge of how those small bits of carbide are currently obtained by the saw manufacture, applicant's recognize that it is possible to saw very small uniform size bits from a wafer of silicon carbide using the present sawing method.

Similarly, sapphire (and other semi-precious material) has application in fashion jewelry. Small pieces of those materials may be cut from a wafer or slice of such semiprecious material using the present method for application to rings, broaches, bracelets and other jewelry. As one appreciates, the present method permits one to retain and use the small bits in an organized manner; retained on the carrier by the trace of thermoplastic material until needed.

It should be understood that the term sawing as used herein is intended to mean the application of a rotating circular saw blade to the piece being sawed.

It is believed that the foregoing description of the preferred embodiments of the invention is sufficient in detail to enable one skilled in the art to make and use the invention without undue experimentation. However, it is expressly understood that the detail of the elements comprising the embodiment presented for the foregoing purpose is not intended to limit the scope of the invention in any way, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. The method of parsing a wafer of crystalline material into multiple pieces comprising the steps of:
    forming a unitary assembly of said wafer, a thermoplastic material, and a support surface, said thermoplastic material adhering to both said wafer and said support surface and said support surface being of a size that covers a side of said wafer;
    sawing through said wafer and thermoplastic material in a predetermined pattern in the outline of said multiple pieces to cut said multiple pieces and the thermoplastic material underlying each of said multiple pieces out of said wafer, leaving said multiple pieces individually attached to said support surface by respective pieces of thermoplastic material; and
    removing said thermoplastic material, leaving said multiple pieces disposed on said support surface.

2. The method of parsing a wafer of crystalline material into multiple pieces as defined in claim 1, further comprising the step of directing a stream of coolant fluid onto said wafer during said step of sawing through said wafer and thermoplastic material.

3. The method of parsing a wafer of crystalline material into multiple pieces as defined in claim 1, wherein said step of removing said thermoplastic material further comprises the step of chemically dissolving said thermoplastic material.

4. The method of parsing a wafer of hard crystalline material into multiple pieces as defined in claim 1, wherein said multiple pieces of said wafer possess an aspect ratio of 2 to 1 or greater.

5. The method of parsing a wafer of crystalline material into multiple pieces as defined in claim 1, wherein said wafer comprises a material having a hardness of 8.0 Mohs or greater.

6. The method of parsing a wafer of crystalline material into multiple pieces as defined in claim 5, wherein said material of said wafer comprises sapphire.

7. The method of parsing a wafer of crystalline material into multiple pieces as defined in claim 1, further comprising the step of:
    covering a surface of said wafer with a protective layer prior to said step of forming said unitary sandwich.

8. The method of parsing a wafer of crystalline material into multiple pieces as defined in claim 7, wherein said protective layer comprises a photoresist.

9. The method of parsing a wafer of crystalline material into multiple pieces, said crystalline material having a hardness of 8 Mohs or greater and said multiple pieces having said wafer possess an aspect ratio of 2:1 or greater, comprising the steps of:
    covering one side of said wafer with a layer of protective material;
    forming a unitary assembly of said wafer, a thermoplastic material, and a support surface, said thermoplastic material adhering to both said wafer and said support surface and said support surface being of a size that covers a side of said wafer;
    sawing through said wafer and thermoplastic material in a predetermined pattern in the outline of said multiple pieces and simultaneously directing a stream of coolant fluid onto said wafer to cut said multiple pieces and the thermoplastic material underlying each of said multiple pieces out of said wafer, leaving said multiple pieces attached individually attached to said support surface by respective pieces of thermoplastic material;

chemically dissolving said layer of protective material;

chemically dissolving said thermoplastic material, leaving said multiple pieces disposed on said support surface; and removing said multiple pieces from said support surface.

10. The method of removing individual semiconductor chips from a semiconductor wafer containing a plurality of semiconductor chips integrally formed on one side of the wafer with the semiconductor chips arranged in a plurality of cells defined by a cross-hatched grid of straight saw lines on said one side of said wafer, comprising the steps of:

applying a protective coating over the one side of said semiconductor wafer containing said plurality of semiconductor chips, said protective coating comprising a photoresist;

attaching the other side of said semiconductor wafer to a carrier substrate using thermoplastic material as an adhesive;

sawing the wafer along each of said straight saw lines through the depth of said thermoplastic material to form a plurality of rectangular semiconductor chips individually attached to said carrier substrate by a respective portion of said thermoplastic material while concurrently directing a stream of coolant fluid at the blade of the sawing saw and onto said semiconductor wafer;

removing said protective coating;

removing said thermoplastic material from beneath said individual rectangular semiconductor chips while leaving said rectangular semiconductor chips in place on said carrier substrate; and individually removing said semiconductor chips from said carrier substrate.

11. The method of removing individual semiconductor chips from a semiconductor wafer as defined in claim 10, wherein said step of applying a protective coating over the one side of said semiconductor wafer comprises the step of:

applying a layer of photoresist over the one side of said semiconductor wafer, said photoresist having a transparent or translucent optical characteristic sufficient to permit observation of said saw lines on said side of said semiconductor wafer.

12. The method of removing individual semiconductor chips from a semiconductor wafer as defined in claim 11, wherein said step of attaching the other side of said semiconductor wafer to a carrier substrate using thermoplastic material as an adhesive, further comprises the steps of:

coating the other side of said semiconductor wafer with thermoplastic material in the liquid state;

heating the thermoplastic coated semiconductor wafer to cure said thermoplastic material and form a solid thermoplastic coating;

pressing said side of said semiconductor wafer containing said solid thermoplastic coating against said carrier substrate and, while continuing said pressing, heating said semiconductor wafer and carrier substrate to the fusing temperature of said thermoplastic material, whereby said thermoplastic material liquifies; and then cooling said wafer, thermoplastic and carrier substrate to re-solidify said thermoplastic.

13. The method of removing individual semiconductor chips from a semiconductor wafer as defined in claim 12, wherein said step of removing said photoresist further comprises chemically dissolving said photoresist; and wherein said step of removing said thermoplastic further comprises chemically dissolving said thermoplastic.

14. The method of removing individual semiconductor chips from a semiconductor wafer as defined in claim 13, wherein said wafer comprises sapphire.

15. The method of removing individual semiconductor chips from a semiconductor wafer as defined in claim 13, wherein said wafer comprises silicon carbide.

16. The method of removing individual semiconductor chips from a semiconductor wafer as defined in claim 13, wherein said semiconductor chips comprise Gallium Nitride.

17. The method of removing individual semiconductor chips from a semiconductor wafer as defined in claim 10, wherein said step of attaching the other side of said semiconductor wafer to a carrier substrate using thermoplastic material as an adhesive, further comprises the steps of:

coating the other side of said semiconductor wafer with thermoplastic material in the liquid state;

heating the thermoplastic coated semiconductor wafer to cure said thermoplastic material and form a solid thermoplastic coating;

pressing said side of said semiconductor wafer containing said solid thermoplastic coating against said carrier substrate and, while continuing said pressing, heating said semiconductor wafer and carrier substrate to the fusing temperature of said thermoplastic material, whereby said thermoplastic material liquefies;

cooling said semiconductor wafer and carrier substrate below said fusing temperature of said thermoplastic material whereby said thermoplastic material re-solidifies and bonds said semiconductor wafer to said substrate carrier.

18. The method of removing individual semiconductor chips from a semiconductor wafer as defined in claim 10, wherein said step of attaching the other side of said semiconductor wafer to a carrier substrate using thermoplastic material as an adhesive, further comprises the steps of:

placing a sheet of thermoplastic material on said carrier substrate;

placing the other side of said semiconductor wafer on said sheet of thermoplastic material;

cutting said sheet of thermoplastic material in a line extending about the periphery of said semiconductor wafer to form a layer in the outline of said semiconductor wafer underlying said semiconductor wafer, and discarding the excess of said sheet outside said formed layer;

pressing said other side of said semiconductor wafer against said formed layer of thermoplastic material and through said formed layer against said carrier substrate and, while continuing said pressing, heating said semiconductor wafer and carrier substrate to the fusing temperature of said thermoplastic material, whereby said thermoplastic material liquifies;

cooling said semiconductor wafer and carrier substrate below said fusing temperature of said thermoplastic material whereby said thermoplastic material re-solidifies and bonds said semiconductor wafer to said substrate carrier.

* * * * *